United States Patent
Baek et al.

(10) Patent No.: US 12,095,001 B2
(45) Date of Patent: Sep. 17, 2024

(54) SINGLE CHIP MULTI BAND LED

(71) Applicant: SEOUL VIOSYS CO., LTD., Gyeonggi-do (KR)

(72) Inventors: Yong Hyun Baek, Gyeonggi-do (KR); Ji Hun Kang, Gyeonggi-do (KR); Chae Hon Kim, Gyeonggi-do (KR); Ji Hoon Park, Gyeonggi-do (KR)

(73) Assignee: Seoul Viosys Co., Ltd., Gyeonggi-do (KR)

(*) Notice: Subject to any disclaimer, the term of this patent is extended or adjusted under 35 U.S.C. 154(b) by 330 days.

(21) Appl. No.: 17/228,225

(22) Filed: Apr. 12, 2021

(65) Prior Publication Data

US 2021/0328100 A1    Oct. 21, 2021

Related U.S. Application Data

(60) Provisional application No. 63/047,525, filed on Jul. 2, 2020, provisional application No. 63/010,852, filed on Apr. 16, 2020.

(51) Int. Cl.
| | |
|---|---|
| *H01L 33/06* | (2010.01) |
| *H01L 27/15* | (2006.01) |
| *H01L 33/24* | (2010.01) |
| *H01L 33/32* | (2010.01) |
| *H01L 33/58* | (2010.01) |
| *H01L 33/62* | (2010.01) |

(52) U.S. Cl.
CPC ............ *H01L 33/06* (2013.01); *H01L 27/156* (2013.01); *H01L 33/24* (2013.01); *H01L 33/32* (2013.01); *H01L 33/58* (2013.01); *H01L 33/62* (2013.01)

(58) Field of Classification Search
CPC ......... H01L 33/06; H01L 33/24; H01L 33/32; H01L 33/58; H01L 33/62
See application file for complete search history.

(56) References Cited

U.S. PATENT DOCUMENTS

| | | | |
|---|---|---|---|
| 2007/0122994 A1 | 5/2007 | Sonobe et al. | |
| 2018/0351039 A1* | 12/2018 | Kim | ........................ H01L 33/32 |
| 2019/0296187 A1 | 9/2019 | Yoo et al. | |

FOREIGN PATENT DOCUMENTS

| | | |
|---|---|---|
| CN | 105552188 A | 5/2016 |
| JP | 4501194 B2 | 7/2010 |
| KR | 101388369 B1 | 4/2014 |
| KR | 1020150103253 A | 9/2015 |
| KR | 1020160112244 A | 9/2016 |
| KR | 101928479 B1 | 2/2019 |

OTHER PUBLICATIONS

International Search Report for International Application No. PCT/KR2021/004717, issued Aug. 5, 2021, English Translation, 5 pages.
European Search Report for European Application No. 21789531.7, issued Apr. 8, 2024, 8 pages.

* cited by examiner

*Primary Examiner* — Mark W Tornow
(74) *Attorney, Agent, or Firm* — LaBatt, LLC

(57) ABSTRACT

A light emitting diode includes an n-type nitride semiconductor layer, an active layer located on the n-type nitride semiconductor layer, and a p-type nitride semiconductor layer located on the active layer. The active layer has a single structure of a multi-quantum well in which a plurality of barrier layers and a plurality of well layers are stacked, and the active layer emits white light.

20 Claims, 9 Drawing Sheets

SINGLE CHIP MULTI BAND LED

CROSS-REFERENCE OF RELATED APPLICATIONS AND PRIORITY

The Present application is a Non-provisional Application which claims the benefit of the filing dates of U.S. Provisional Applications Nos. 63/010,852 filed Apr. 16, 2020 and 63/047,525 filed Jul. 2, 2020, the disclosure of which are incorporated herein by reference in their entirety.

TECHNICAL FIELD

The present disclosure relates to a light emitting diode, and more particularly, to a light emitting diode that emits light having multi bands at a single chip level.

BACKGROUND

A nitride semiconductor is used as a light source of a display apparatus, traffic light, lighting, or an optical communication device, and is mainly used in a light emitting diode or a laser diode that emits blue or green light. In addition, the nitride semiconductor may be used in a heterojunction bipolar transistor (HBT), a high electron mobility transistor (HEMT), and the like.

In general, a light emitting diode using the nitride semiconductor has a heterojunction structure having a quantum well structure between an N contact layer and a P contact layer. The light emitting diode emits light according to a composition of a well layer in the quantum well structure. In order to increase an internal quantum efficiency and reduce the loss due to light absorption, the light emitting diode is designed to emit light of a spectrum having a single peak, that is, monochromatic light.

Mixed color light, such as white light, emitted from lighting or the like cannot be implemented as single-peak monochromatic light. Accordingly, techniques of implementing white light generally use a plurality of light emitting diodes together emitting different monochromatic light from each other, or a phosphor converting a wavelength of light emitted from the light emitting diode.

The use of phosphors comes with cost of the phosphor itself or a decrease in efficiency known as Stoke's shift. Furthermore, in Li-Fi which transmits information using visible light with a wide frequency band, a general white LED using a yellow phosphor generally has a slow data transmission speed. Due to slowing a frequency response, the general white LED may not be suitable for visible light communication (VLC). In addition, a process of applying the phosphor on the light emitting diode is required and the phosphor may involve yellowing of a carrier carrying the phosphor.

On the other hand, using a mixture of a plurality of light emitting diodes also complicates the process. It is inconvenient to prepare light emitting diodes made of different materials.

SUMMARY

Using a single-chip light emitting diode may implement light having a spectrum of multi-bands and use of a plurality of light emitting diodes or phosphor may be avoided.

There have been attempts to implement light having a spectrum of multi bands by varying compositions of the well layers in the conventional quantum well structure, but satisfactory achievement has not been obtained. In particular, recombination of electrons and holes mainly occurs in a particular well layer, and it is difficult to generate light having multi bands.

Exemplary embodiments provide a light emitting diode of a novel structure capable of implementing light having a spectrum of multi bands at a single chip level.

Exemplary embodiments provide an LED light source suitable for visible light communication (VLC) such as Li-Fi.

In one or more embodiments according to the teachings of the present disclosure, a light emitting diode includes an n-type nitride semiconductor layer, an active layer located on the n-type nitride semiconductor layer, and a p-type nitride semiconductor layer located on the active layer. The active layer has a single structure of a multi-quantum well in which a plurality of barrier layers and a plurality of well layers are stacked, and the active layer emits white light.

The active layer may emit light having two peak wavelengths as a driving current increases.

Light emitted from the active layer may change from yellow light to white light as the driving current increases.

In at least one variant, the light emitting diode may further include a V-pit generation layer disposed between the n-type nitride semiconductor layer and the active layer, and a portion of the active layer may be formed in a V-pit of the V-pit generation layer.

In another variant, the V-pit generation layer may have a thickness exceeding 450 nm, and the V-pits formed in the V-pit generation layer may include a V-pit having a width of an inlet exceeding 230 nm.

In further another variant, the light emitting diode may further include a p-type AlGaN layer interposed between the active layer and the p-type nitride semiconductor layer, where a composition ratio x of Al in the p-type AlGaN layer may be greater than 0 and less than 0.3.

By way of example, the p-type AlGaN layer may have a thickness of less than 100 nm.

In yet another variant, the active layer may have a multi-quantum well structure having a plurality of well layers and a plurality of barrier layers, and may further include a capping layer covering the well layer between the well layer and the barrier layer, in which the capping layer may contain Al.

In some forms, the light emitting diode may have a flip-chip structure.

In other forms, the light emitting diode may have a plurality of light emitting cells.

The light emitting diode may include light emitting cells having different light emitting areas from one another.

Further, the light emitting diode may include light emitting cells connected in series.

In one or more embodiments according to the teachings of the present disclosure, a light emitting apparatus includes a light emitting diode, and a color filter. The light emitting diode includes an n-type nitride semiconductor layer, an active layer located on the n-type nitride semiconductor layer, and a p-type nitride semiconductor layer located on the active layer. The active layer has a single structure of a multi-quantum well in which a plurality of barrier layers and a plurality of well layers are stacked, and the active layer emits light having at least two peak wavelengths.

In at least one variant, the color filter may be a band pass filter, a long wavelength transmission filter, or a short wavelength transmission filter.

DETAILED DESCRIPTION OF EMBODIMENTS

Figure 1:
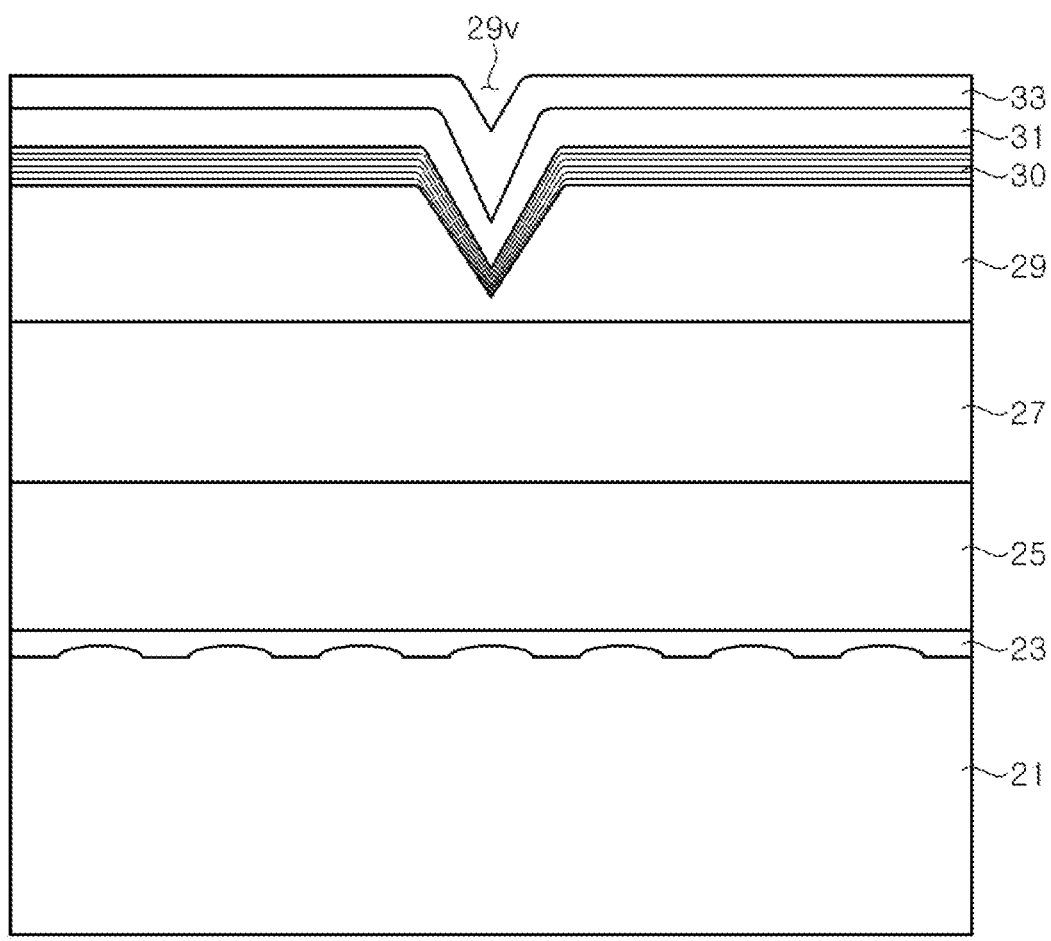
FIG. 1 is a schematic cross-sectional view illustrating a light emitting diode according to an exemplary embodiment.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of devices can be exaggerated for clarity and descriptive purposes. When an element or layer is referred to as being "disposed above" or "disposed on" another element or layer, it can be directly "disposed above" or "disposed on" the other element or layer or intervening devices or layers can be present. Throughout the specification, like reference numerals denote like devices having the same or similar functions.

Figure 2A:
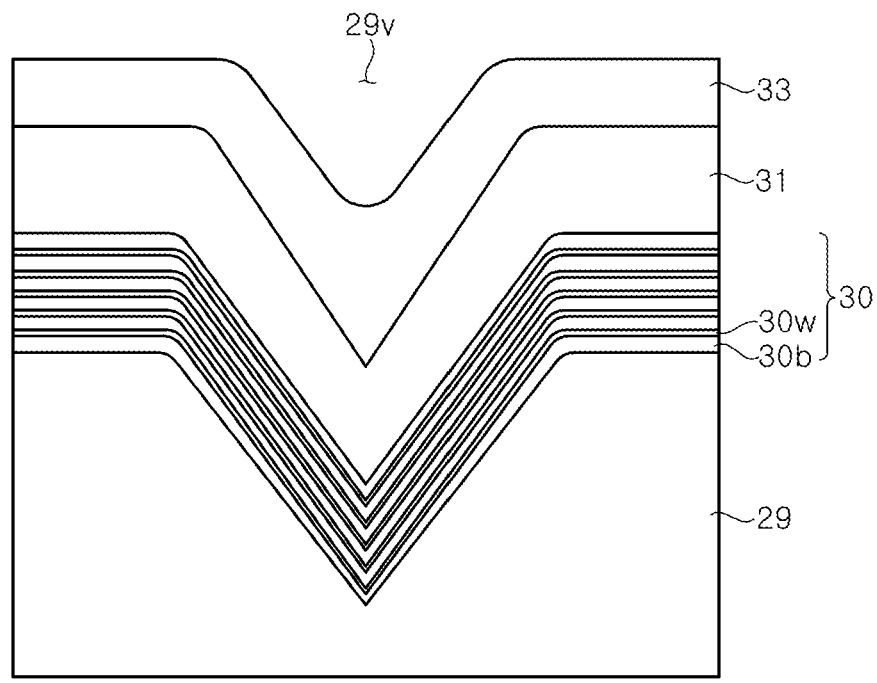
FIG. 2A is a schematic partial cross-sectional view showing an enlarged portion of FIG. 1 to describe a light emitting diode.
Figure 2B:
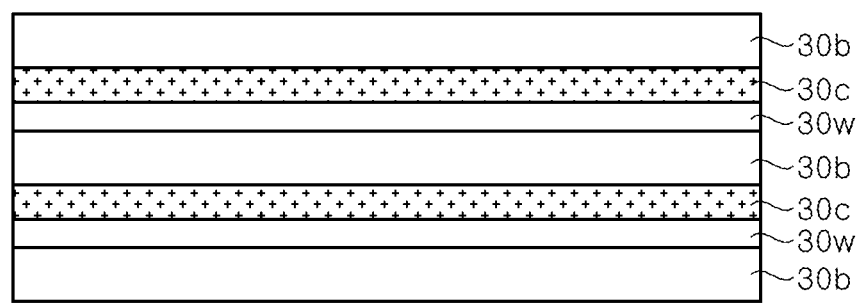
FIG. 2B is a schematic partial cross-sectional view showing an enlarged portion of FIG. 2A to describe a light emitting diode.
Figure 3:
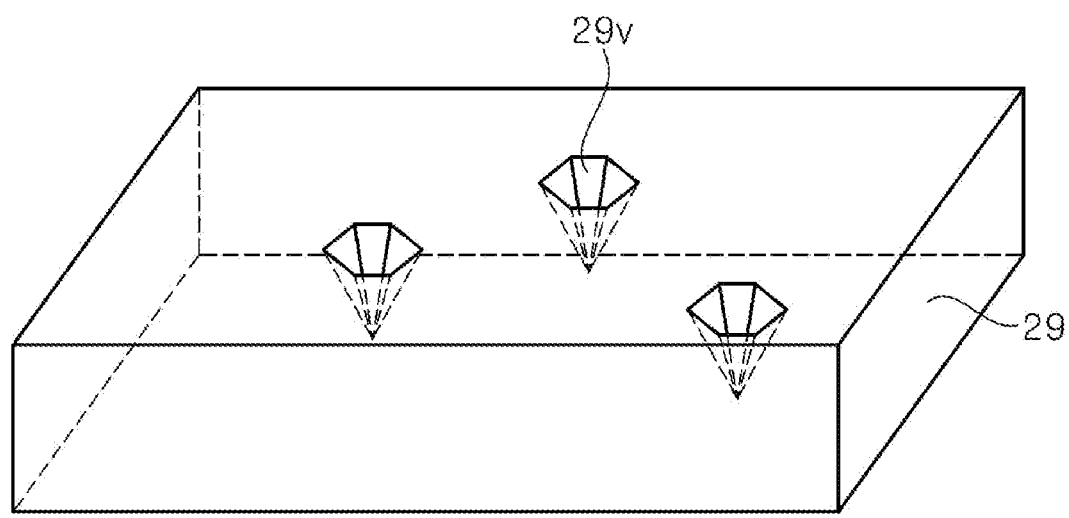
FIG. 3 is a schematic perspective view showing an enlarged V-pit generation layer to describe a light emitting diode.

FIG. 1 is a schematic cross-sectional view illustrating a light emitting diode according to an exemplary embodiment, FIG. 2A is a schematic partial cross-sectional view showing an enlarged portion of FIG. 1 to describe the light emitting diode, FIG. 2B is a schematic partial cross-sectional view showing an enlarged portion of FIG. 2A to describe the light emitting diode, and FIG. 3 is a schematic perspective view showing an enlarged V-pit generation layer to describe the light emitting diode.

First, referring to FIG. 1, the light emitting diode may include a substrate 21, a nucleation layer 23, a high-temperature buffer layer 25, an n-type nitride semiconductor layer 27, a V-pit generation layer 29, and an active layer 30, a p-type AlGaN layer 31, and a p-type nitride semiconductor layer 33.

The substrate 21 is for growing a gallium nitride-based semiconductor layer, and a sapphire substrate, a GaN substrate, a SiC substrate, a Si substrate, a spinel substrate, or the like may be used as the substrate 21. The substrate 21 may have protrusions as shown in FIG. 1, and may be, for example, a patterned sapphire substrate. However, the inventive concepts are not limited thereto, and may be a substrate having a flat upper surface thereof, for example, a sapphire substrate.

The nucleation layer 23 may be formed of (Al, Ga)N on the substrate 21 at a low temperature of 400° C. to 600° C., and for example, may be formed of AlGaN or GaN. A composition of the nucleation layer 23 may be changed according to the substrate 21. For example, when the substrate 21 is a patterned sapphire substrate, the nucleation layer 23 may be formed of AlGaN, and when the substrate 21 is a sapphire substrate having a flat upper surface, the nucleation layer 23 may be formed of GaN. The nucleation layer 23 may be formed to have a thickness of about 25 nm, for example.

The high-temperature buffer layer 25 may be grown at a relatively high temperature so as to mitigate occurrence of defects such as dislocations between the substrate 21 and the n-type nitride semiconductor layer 27. The high-temperature buffer layer 25 may be formed of undoped GaN or GaN doped with n-type impurities. While the high-temperature buffer layer 25 is being formed, threading dislocations are generated due to lattice mismatch between the substrate 21 and the high-temperature buffer layer 25. The high-temperature buffer layer 25 may be formed to have a thickness of, for example, about 4.2 μm.

The n-type nitride semiconductor layer 27 is a nitride-based semiconductor layer doped with n-type impurities, and may be formed of, for example, a GaN layer doped with Si. A doping concentration of Si doped to the n-type nitride semiconductor layer 27 may be from $5E17/cm^2$ to $5E19/cm^2$. The n-type nitride semiconductor layer 27 may be grown under a growth pressure of 150 Torr to 200 Torr at 1000° C. to 1200° C. (for example, 1050° C. to 1100° C.) by supplying a metal source gas into a chamber using Metal-Organic Chemical Vapor Deposition (MOCVD) technology. In this case, the n-type nitride semiconductor layer 27 may be continuously formed on the high-temperature buffer layer 25, and the threading dislocations formed in the high-temperature buffer layer 25 may be transferred to the n-type nitride semiconductor layer 27. The n-type nitride semiconductor layer 27 may be formed to be relatively thinner than the high-temperature buffer layer 25, and may be formed to have, for example, a thickness of about 2.5 μm.

The V-pit generation layer 29 is located over the n-type nitride semiconductor layer 27. In an exemplary embodiment, the V-pit generation layer 29 may be formed of, for example, a GaN layer. The V-pit generation layer 29 may be grown at a temperature relatively lower than that the temperature for growing the n-type nitride semiconductor layer 27, for example, about 900° C., and thus, V-pits are formed in the V-pit generation layer 29.

Since the V-pit generation layer 29 is grown at a relatively lower temperature than that for growing the n-type nitride semiconductor layer 27, crystal quality may be artificially degraded and promote three-dimensional growth, and thus, a V-pit 29v may be formed.

As shown in FIG. 3, when a growth surface of the nitride semiconductor layer is a C-plane, the V-pits 29v may have a hexagonal cone shape. The V-pits 29v may be formed at upper ends of the threading dislocations.

The V-pit generation layer 29 may be formed to have a thickness thinner than that of the n-type nitride semiconductor layer 27, and may be formed to have, for example, a thickness of about 450 nm to 600 nm. A size of the V-pits 29v formed in the V-pit generation layer 29 may be adjusted through a growth condition and a growth time of the V-pit generation layer 29. In an exemplary embodiment, a maximum width of an inlet of the V-pit 29v formed in the V-pit generation layer 29 may generally exceed about 230 nm.

The thickness of the V-pit generation layer 29 particularly affects the size of the V-pit 29v. Moreover, the size of the V-pit 29v is considered to have an effect on generating light having a spectrum of multi bands.

In the illustrated exemplary embodiment, the V-pit generation layer 29 is described as being a single layer, but the inventive concepts are not limited thereto, and the V-pit generation layer 29 may be multiple layers. For example, the V-pit generation layer 29 may include at least two layers among GaN, AlGaN, InGaN, or AlGaInN layers.

The active layer 30 is located on the V-pit generation layer 29. The active layer 30 emits light by recombination of electrons and holes. In addition, the active layer 30 may have a single structure of a multi-quantum well (MQW) in which barrier layers 30b and well layers 30w are alternately stacked.

The active layer 30 may contact the V-pit generation layer 29, but the inventive concepts are not limited thereto. The active layer 30 may be formed along the V-pit 29v. A thickness of the active layer 30 formed in the V-pit 29v is smaller than that of the active layer 30 formed on a flat surface of the V-pit generation layer 29. The thickness of the active layer 30 in the V-pit 29v may vary depending on a depth of the V-pit 29v. At an intermediate depth of the V-pit 29v, the thickness of the active layer 30 may be less than about ⅓ of the thickness of the active layer 30 formed on the flat surface of the V-pit generation layer 29. In particular, a thickness of the well layer 30w at the intermediate depth of the V-pit 29v may be less than about ⅓ of the thickness of the well layer 30w formed on the flat surface of the V-pit generation layer 29.

Meanwhile, the well layer 30w may be formed of $In_xAl_yGa_{1-x-y}N$ (0<x<1, 0≤y<1). A composition ratio of In, Al, and Ga may be selected according to required light. In particular, the well layer 30w (hereinafter, a first well layer portion) formed on the flat surface of the V-pit generation layer 29 has a composition that emits light having a longer wavelength spectrum of the multi bands. Meanwhile, the well layer 30w (hereinafter, a second well layer portion) formed in the V-pit 29v has a composition that emits light having a shorter wavelength spectrum of the multi bands. For example, an Indium (In) composition ratio in the first well layer portion is higher than that in the second well layer portion, the first well layer portion may be formed of InGaN to emit yellow light, and the second well layer portion may be formed of InGaN to emit green and/or blue light.

The second well layer portion may be formed with an identical composition on each side surface of the V-pit 29v, but the inventive concepts are not limited thereto, and may be formed with a different composition from one another on each side surface. As such, the light emitting diode of the present disclosure may implement light having at least two bands at a single chip level using the first well layer portion and the second well layer portion.

The barrier layer 30b may be formed of a nitride semiconductor layer such as GaN, InGaN, AlGaN, AlInGaN, or the like, which has a wider band gap than that of the well layer 30w. For example, when the first well layer portion is formed of InGaN to emit yellow light, the barrier layer 30b may be formed of InGaN having a lower In content than that of the well layer 30w.

Meanwhile, as shown in FIG. 2B, a capping layer 30c may be interposed between the well layer 30w and the barrier layer 30b. The capping layer 30c may be formed before the deposition of the barrier layer 30b to prevent Indium (In) in the well layer 30w from being dissociated while the barrier layer 30b is deposited. The capping layer 30c may include Al, and may be formed of, for example, AlGaN or AlInGaN. An Al composition of a first capping layer portion, that is, a capping layer portion disposed on the flat surface of the V-pit generation layer 29, and an Al composition of a second capping layer portion, that is, a capping layer portion formed in the V-pit 29v may be different from each other. The Al content in the first capping layer portion is higher than that in the second capping layer portion. For example, the Al composition in the first capping layer portion may be 10 atomic % or more, more specifically, 12 atomic % or more with respect to a total Al composition in the capping layer, and the Al composition in the second capping layer portion may be about 5 atomic % or more with respect to the total Al composition in the capping layer.

Remaining capping layers 30c, except for a last capping layer 30c closest to the p-type nitride semiconductor layer 33, may be formed to have a thickness substantially similar to or smaller than that of an adjacent well layer 30w. The last capping layer 30c may be formed thicker than the well layer 30w adjacent thereto.

The p-type AlGaN layer 31 is located on the active layer 30. The p-type AlGaN layer 31 may also be formed in the V-pit 29v. A composition ratio of Al in the p-type AlGaN layer 31 is relatively low compared to a composition ratio of Al used in an electron blocking layer. In addition, the composition ratio of Al in the p-type AlGaN layer 31 may be smaller than that in the capping layer 30c. For example, the p-type AlGaN layer 31 may be represented by a general formula $Al_xGa_{1-x}N$, where x may be greater than 0 and less than 0.3. Meanwhile, in an exemplary embodiment, a thickness of the p-type AlGaN layer 31 may be less than about 100 nm, and in at least one variant, it may be about 70 nm.

The p-type nitride semiconductor layer 33 may be formed of a semiconductor layer, for example, GaN doped with a p-type impurity such as Mg. The p-type nitride semiconductor layer 33 may be a single layer or multiple layers, and may include a p-type contact layer. As shown in FIG. 1, the p-type nitride semiconductor layer 33 may have a concave groove in the V-pit 29v. Since the p-type nitride semiconductor layer 33 does not completely fill the V-pit 29v, loss of light generated in the well layer 30w in the V-pit 29v may be prevented.

Light emitting diodes may be manufactured in various types such as a lateral type, a flip-chip type, or others, which are available in the art.

Figure 4A:
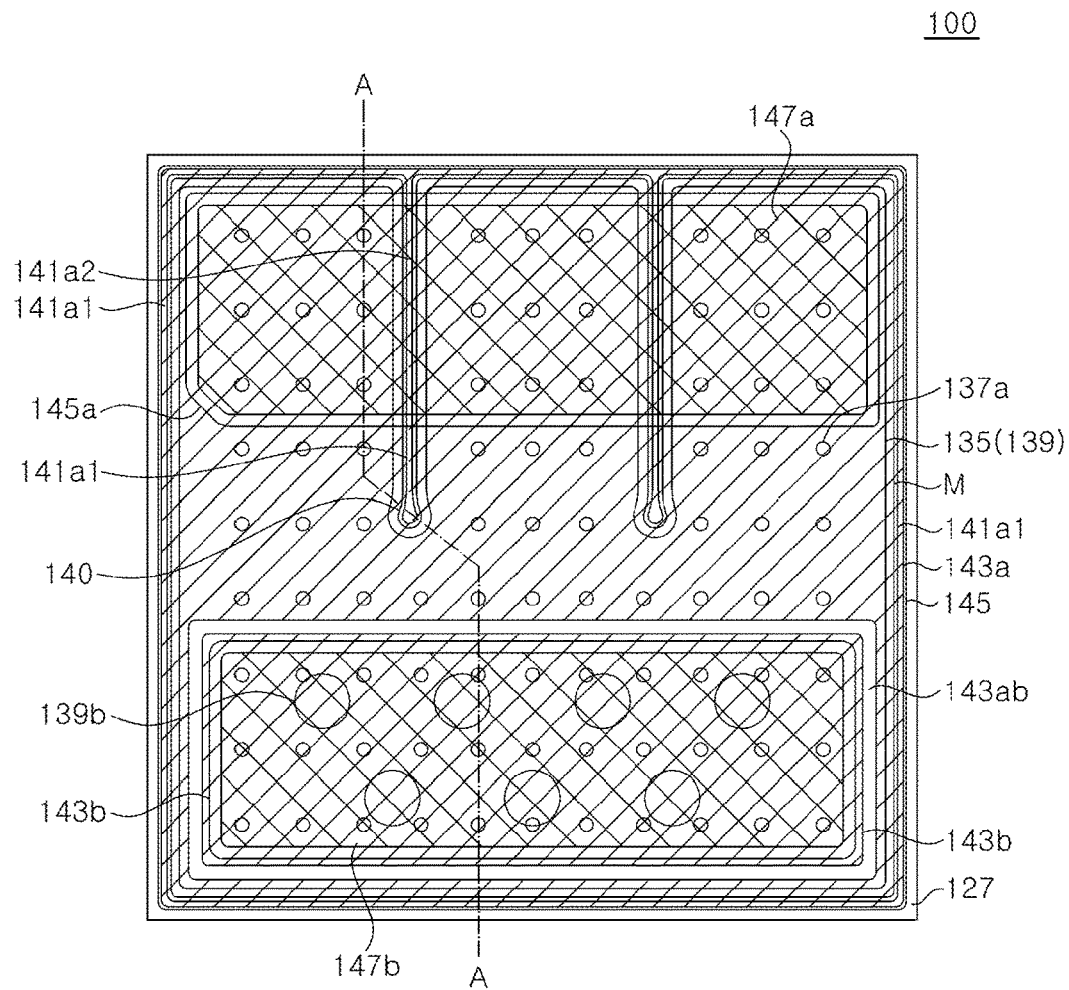
FIG. 4A is a schematic plan view showing a flip-chip type light emitting diode according to an exemplary embodiment.
Figure 4B:
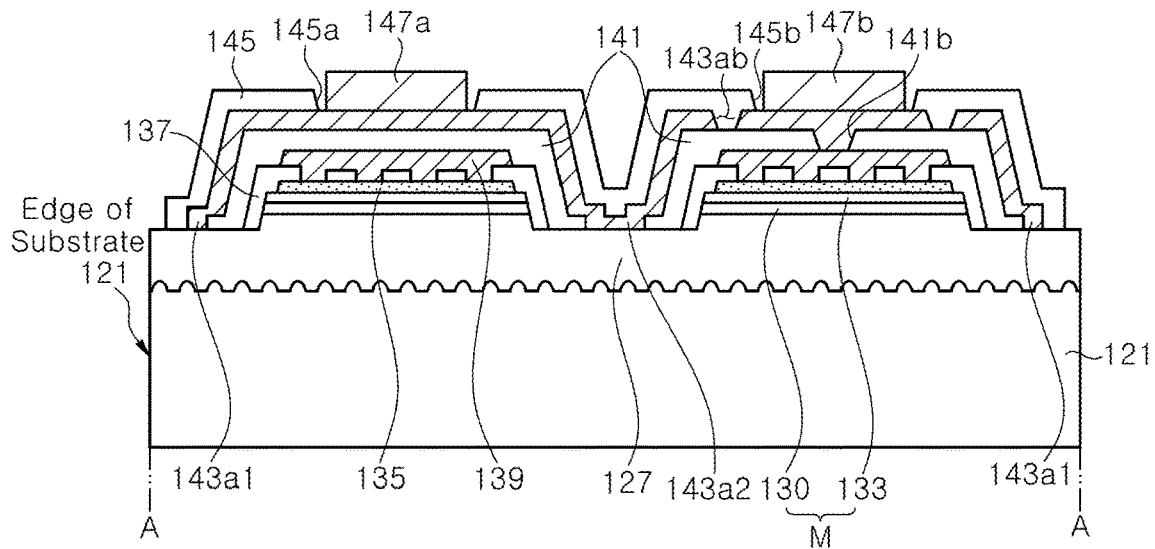
FIG. 4B is a schematic cross-sectional view taken along line A-A of FIG. 4A.

FIG. 4A is a schematic plan view showing a flip-chip type light emitting diode according to an exemplary embodiment, and FIG. 4B is a schematic cross-sectional view taken along line A-A of FIG. 4A.

Referring to FIGS. 4A and 4B, the flip-chip type light emitting diode 100 includes a substrate 121, a first conductivity type semiconductor layer 127, an active layer 130, a second conductivity type semiconductor layer 133, and a conductive oxide layer 135, a dielectric layer 137, a metal reflection layer 139, a lower insulation layer 141, a first pad metal layer 143a (FIG. 4A), a second pad metal layer 143b, and an upper insulation layer 145. Moreover, the light emitting diode may further include a first bump pad 147a and a second bump pad 147b.

The substrate 121 is identical to the substrate 21 described above, and a detailed description thereof will be omitted to avoid redundancy. The substrate 121 may have a rectangular or square shape as shown in FIG. 4A, but the inventive concepts are not limited thereto. A size of the substrate 121 is not particularly limited but may be variously selected.

The first conductivity type semiconductor layer 127 is disposed on the substrate 121. The first conductivity type semiconductor layer 127 is identical to the n-type nitride semiconductor layer 27 described above, and a detailed description thereof is omitted to avoid redundancy. The nucleation layer 23 and the high temperature buffer layer 25 as shown in FIG. 1 may be interposed between the substrate 121 and the first conductivity type semiconductor layer 127.

In some forms, an edge of the first conductivity type semiconductor layer 127 is flush with an edge of the substrate 121. However, the inventive concepts are not limited thereto, and in other forms, the first conductivity type semiconductor layer 127 may be located inside a region surrounded by the edge of the substrate 121. In this case, a partial region of an upper surface of the substrate 121 may be exposed along a periphery of the first conductivity type semiconductor layer 127.

A mesa M is disposed on the first conductivity type semiconductor layer 127. The mesa M may be disposed within an inner region surrounded by the first conductivity type semiconductor layer 127, and thus, regions near the edge of the first conductivity type semiconductor layer 127 are not covered by the mesa M but they are exposed to the outside.

The mesa M includes the active layer 130 and the second conductivity type semiconductor layer 133. The active layer 130 is interposed between the first conductivity type semiconductor layer 127 and the second conductivity type semiconductor layer 133. Meanwhile, although not shown in the drawing, a V-pit generation layer is interposed between the first conductivity type semiconductor layer 127 and the active layer 130. The V-pit generation layer may be located within a lower region of the mesa M, but the inventive concepts are not limited thereto, and may be located over an entire upper surface of the first conductivity type semiconductor layer 127. Since the V-pit generation layer is substantially similar to the V-pit generation layer 29 described above with reference to FIG. 1, a detailed description is omitted to avoid redundancy.

Since the active layer 130 is also similar to the active layer 30 described with reference to FIGS. 1 through 3, a detailed description thereof will be omitted to avoid redundancy. The active layer 130 emits light having multiple peak wavelengths as a current density increases.

Meanwhile, since the second conductivity type semiconductor layer 133 is identical to the p-type nitride semiconductor layer 33 described with reference to FIG. 1, a detailed description thereof will be omitted to avoid redundancy. Further, although not shown in FIG. 4B, a p-type AlGaN layer 31 is disposed between the second conductivity type semiconductor layer 133 and the active layer 130 as described with reference to FIG. 1.

In some forms, a concentration of a p-type impurity in the second conductivity type semiconductor layer 133 may range from $8 \times 10^{-18}$ to $4 \times 10^{-21}/cm^3$. In other forms, the concentration of the p-type impurity in the second conductivity type semiconductor layer 133 does not have a constant value, and it may have a concentration profile that varies along a thickness within the above range. In particular, a higher impurity concentration may be obtained on a surface of the second conductivity type semiconductor layer 133.

In the mesa M, as shown in FIG. 4A, an indentation 140 penetrating into the inside may be formed, and an upper surface of the first conductivity type semiconductor layer 127 may be exposed by the indentation 140. The indentation 140 may be formed lengthwise inside the mesa M from one edge of the mesa M toward another edge facing to the one edge. A length of the indentation 140 is not particularly limited, but it may be ½ or longer than a length of the mesa M. Further, although two indentations 140 are shown in FIG. 4A, the number of indentations 140 may be one or three or more. As the number of indentations 140 increases, the number of internal contact portions 143a2 of the first pad metal layer 143a increases, which will be described later, thereby improving a current spread performance.

The indentation 140 has an end portion having a widened width and a round shape, as shown in FIG. 4A. The lower insulation layer 141 may be patterned in a similar shape by making the shape of the end portion of the indentation 140 in this manner. In particular, in a case that the lower insulation layer 141 includes a distributed Bragg reflector, the lower insulation layer 141 having a widened width at the end portion as shown in FIG. 4A, may prevent formation of a severe double step on a sidewall of the distributed Bragg reflector. Furthermore, cracks, which are likely to occur in the first pad metal layer 143a due to an inclination angle of the sidewall increases, may also be prevented. As the shape of the end portion of the indentation 140 and that of the end portion of the first opening 141a2 of the lower insulation layer 141 are made as described above, an edge of the lower insulation layer 141 is formed to have a gentle inclination angle, thereby improving a yield of the light emitting diode.

In another variant, the mesa M may have at least one via hole passing through the second conductivity type semiconductor layer 133 and the active layer 130 instead of the indentation 140.

Meanwhile, the conductive oxide layer 135 is disposed over the mesa M to contact the second conductivity type semiconductor layer 133. The conductive oxide layer 135 may be disposed over some or almost all of an entire region of the mesa M in an upper region of the mesa M. For example, the conductive oxide layer 135 may cover 80% or more, and further, 90% or more of the upper region of the mesa M.

The conductive oxide layer 135 is formed of an oxide layer that transmits light generated in the active layer 130. The conductive oxide layer 135 may be formed of, for example, indium tin oxide (ITO), ZnO, or the like. The conductive oxide layer 135 is formed to have a thickness sufficient to make ohmic contact with the second conductivity type semiconductor layer 133, and for example, may be formed to have a thickness within a thickness range of about 3 nm to about 50 nm. More specifically, the thickness of the conductive oxide layer 135 may be within a thickness range of about 6 nm to about 30 nm. When the thickness of the conductive oxide layer 135 is too thin, sufficient ohmic characteristics cannot be provided, which results in increase of a forward voltage. In addition, when the thickness of the conductive oxide layer 135 is too thick, loss due to light absorption occurs, thereby reducing luminous efficiency.

The dielectric layer 137 covers the conductive oxide layer 135, and further, may cover the second conductivity type semiconductor layer 133, the active layer 130, and side surfaces of the first conductivity type semiconductor layer 127. An edge of the dielectric layer 137 may be covered with the lower insulation layer 141. Accordingly, the edge of the dielectric layer 137 is located farther from the edge of the substrate 121 than the edge of the lower insulation layer 141, as shown in FIG. 4B. However, the inventive concepts are not limited thereto, and a portion of the dielectric layer 137 may be exposed to the outside of the lower insulation layer 141.

The dielectric layer 137 has openings 137a exposing the conductive oxide layer 135 as shown in FIG. 4A. A plurality of openings 137a may be disposed over the conductive oxide layer 135. The openings 137a are used as connection passages so that the metal reflection layer 139 can connect to the conductive oxide layer 135. The dielectric layer 137 also exposes the first conductivity type semiconductor layer 127 around the mesa M, and exposes the first conductivity type semiconductor layer 127 in the indentation 140.

The dielectric layer 137 is formed of an insulating material having a refractive index lower than those of the second conductivity type semiconductor layer 133 and the conductive oxide layer 135. The dielectric layer 137 may be formed of, for example, $SiO_2$.

A thickness of the dielectric layer 137 affects the forward voltage and light output of the light emitting diode. The thickness of the dielectric layer 137 may have a thickness in a range of about 200 nm to about 1000 nm, and specifically may have a thickness in a range of about 300 nm to about 800 nm. When the thickness of the dielectric layer 137 is less than 200 nm, the forward voltage is high and the light output is low, which is not favorable. Meanwhile, when the thickness of the dielectric layer 137 exceeds 400 nm, the light output is saturated, and the forward voltage is likely to increase again. Therefore, it is advantageous that the thickness of the dielectric layer 137 does not exceed 1000 nm, and more particularly, the thickness may be 800 nm or less. Moreover, the thickness of the dielectric layer 137 may be 4 times or more and 13 times or less of a thickness of the second conductivity type semiconductor layer 133 on the active layer 130.

The metal reflection layer 139 is disposed on the dielectric layer 137 and is connected to the conductive oxide layer 135 through the openings 137a. The metal reflection layer 139 includes a reflective metal, and may include Ag or Ni/Ag, for example. Further, the metal reflection layer 139 may include a barrier layer for protecting the reflective metal material layer, such as Ni, and may also include an Au layer to prevent oxidation of the metallic layers. Furthermore, to improve the adhesion of the Au layer, a Ti layer may be included under the Au layer. The metal reflection layer 139 is in contact with an upper surface of the dielectric layer 137, and thus, the thickness of the dielectric layer 137 is equal to a separation distance between the conductive oxide layer 135 and the metal reflection layer 139.

The ohmic contact is formed with the conductive oxide layer 135, and the metal reflection layer 139 is disposed on the dielectric layer 137. Thus, it is possible to prevent an increase in ohmic resistance due to solder or the like. Further, since the conductive oxide layer 135, the dielectric layer 137, and the metal reflection layer 139 are disposed on the second conductivity type semiconductor layer 133, the reflectance of light may be improved, thereby improving luminous efficiency.

The lower insulation layer 141 covers the mesa M and the metal reflection layer 139. The lower insulation layer 141 may also cover the first conductivity type semiconductor layer 127 along a periphery of the mesa M, and may cover the first conductivity type semiconductor layer 127 in the indentation 140 inside the mesa M. The lower insulation layer 141 particularly covers a side surface of the mesa M. The lower insulation layer 141 may also cover the dielectric layer 137.

The lower insulation layer 141 has first openings 141a1 and 141a2 exposing the first conductivity type semiconductor layer 127 and a second opening 141b exposing the metal reflection layer 139. The first opening 141a1 exposes the first conductivity type semiconductor layer 127 along the periphery of the mesa M, and the first opening 141a2 exposes the first conductivity type semiconductor layer 127 in the indentation 140. When the via hole is formed instead of the indentation 140, the first opening 141a2 exposes the first conductivity type semiconductor layer 127 in the via hole.

As shown in FIG. 4A, the first opening 141a1 and the first opening 141a2 may be connected to each other. However, the inventive concepts are not limited thereto, and the first openings 141a1 and 141a2 may be spaced apart from each other.

In the exemplary embodiment, the first opening 141a1 of the lower insulation layer 141 is formed to expose all of peripheral regions thereof including the edge of the first conductivity type semiconductor layer 127. However, the inventive concepts are not limited thereto, and the first opening 141a1 of the lower insulation layer 141 may be formed in a band shape along the periphery of the mesa M. In this case, the edge of the first conductivity type semiconductor layer 127 may be covered with the lower insulation layer 141 or flush with the edge of the lower insulation layer 141.

The second opening 141b exposes the metal reflection layer 139. A plurality of second openings 141b may be formed, and these second openings 141b may be disposed near one edge of the substrate 121 to face the indentation 140. Locations of the second openings 141b will be described again later.

Meanwhile, the lower insulation layer 141 may be formed of a single layer of $SiO_2$ or $Si_3N_4$, but the inventive concepts are not limited thereto. For example, the lower insulation layer 141 may have a multilayer structure including a silicon nitride layer and a silicon oxide layer. The lower insulation layer 141 may include a distributed Bragg reflector in which a silicon oxide layer and a titanium oxide layer are alternately stacked.

The first pad metal layer 143a is disposed on the lower insulation layer 141, and is insulated from the mesa M and the metal reflection layer 139 by the lower insulation layer 141. The first pad metal layer 143a contacts the first conductivity type semiconductor layer 127 through the first openings 141a1 and 141a2 of the lower insulation layer 141. The first pad metal layer 143a may include an external contact portion 143a1 in contact with the first conductivity type semiconductor layer 127 along the periphery of the mesa M, and an internal contact portion 143a2 in contact with the first conductivity type semiconductor layer 127 in the indentation 140 or via hole. The external contact portion 143a1 contacts the first conductivity type semiconductor layer 127 near the edge of the substrate 121 along the periphery of the mesa M, and the internal contact portion 143a2 contacts the first conductivity type semiconductor layer 127 in a region surrounded by the external contact portion 143a1. The external contact portion 143a1 and the internal contact portion 143a2 may be connected to each other, but the inventive concepts are not limited thereto, and may be spaced apart from each other. In addition, in some forms, the external contact portion 143a1 may continuously contact the first conductivity type semiconductor layer 127 along the periphery of the mesa M, but the inventive concepts are not limited thereto. In other forms, a plurality of external contact portions 143a1 are disposed to be spaced apart from one another.

The second pad metal layer 143b is disposed in the upper region of the mesa M on the lower insulation layer 141, and it is electrically connected to the metal reflection layer 139 through the second opening 141b of the lower insulation layer 141. The second pad metal layer 143b may be surrounded by the first pad metal layer 143a, and a boundary region 143ab may be formed therebetween. The lower insulation layer 141 is exposed in the boundary region 143ab, and the boundary region 143ab is covered with the upper insulation layer 145 which will be described later.

In some forms, the first pad metal layer 143a and the second pad metal layer 143b may be formed together with an identical material in a single process. In other forms, the first pad metal layer 143a and the second pad metal layer 143b may be formed separately. The first and second pad metal layers 143a and 143b may include an ohmic reflection layer such as an Al layer, and the ohmic reflection layer may be formed on an adhesive layer such as Ti, Cr, Ni, or the like. In addition, a protection layer having a single layer structure or a composite layer structure such as Ni, Cr, or Au may be formed on the ohmic reflection layer. The first and second pad metal layers 143a and 143b may have a multilayer structure of, for example, Cr/Al/Ni/Ti/Ni/Ti/Au/Ti.

The upper insulation layer 145 covers the first and second pad metal layers 143a and 143b. Also, the upper insulation layer 145 may cover the first conductivity type semiconductor layer 127 along the periphery of the mesa M. In the exemplary embodiment, the upper insulation layer 145 may expose the first conductivity type semiconductor layer 127 along the edge of the substrate 121. However, the inventive concepts are not limited thereto, and the upper insulation layer 145 may cover all of the first conductivity type semiconductor layer 127 or may be flush with the edge of the substrate 121.

Meanwhile, the upper insulation layer 145 has a first opening 145a exposing the first pad metal layer 143a and a second opening 145b exposing the second pad metal layer 143b, as shown in FIG. 4B. The first opening 145a and the second opening 145b may be disposed in the upper region of the mesa M, and may be disposed to face each other. In particular, the first opening 145a and the second opening 145b may be disposed close to both edges of the mesa M.

The upper insulation layer 145 may be formed of a single layer of $SiO_2$ or $Si_3N_4$, but the inventive concepts are not limited thereto. In some forms, the upper insulation layer 145 may have a multilayer structure including a silicon nitride layer and a silicon oxide layer. In other forms, the upper insulation layer 145 may include a distributed Bragg reflector in which a silicon oxide layer and a titanium oxide layer are alternately stacked.

The first bump pad 147a electrically contacts the exposed first pad metal layer 143a through the first opening 145a of the upper insulation layer 145, and the second bump pad 147b electrically contacts the exposed second pad metal layer 143b through the second opening 145b. As shown in FIG. 4A, the first bump pad 147a may be disposed in the first opening 145a of the upper insulation layer 145, and the second bump pad 147b may be disposed in the opening 145b of the second bump pad 147b. However, the inventive concepts are not limited thereto, and the first bump pad 147a and the second bump pad 147b may cover all of the first opening 145a and the second opening 145b and seal them, respectively. Further, the second bump pad 147b may cover an upper region of the second opening 141b of the lower insulation layer 141. The second bump pad 147b may cover substantially all of the second openings 141b of the lower insulation layer 141, but the inventive concepts are not limited thereto. In other forms, a portion of the openings 141b may be located to extend beyond the second bump pad 147b, as shown in FIG. 4B.

In addition, as shown in FIG. 4A, the second bump pad 147b may be disposed within the upper region of the second pad metal layer 143a. However, the inventive concepts are not limited thereto, and a portion of the second bump pad 147b may be overlapped with the first pad metal layer 143a. However, the upper insulation layer 145 may be disposed between the first pad metal layer 143a and the second bump pad 147b to insulate them.

According to one or more embodiments of the present disclosure, a reflection structure of the conductive oxide layer 135, the dielectric layer 137, and the metal reflection layer 139 is used instead of a conventional ohmic reflection layer. Accordingly, it is possible to block intrusion of a bonding material such as solder into the contact region, and to secure a stable ohmic contact resistance, thereby improving the reliability of the light emitting diode. Furthermore, by making the dielectric layer 137 thicker than 300 nm, a high light output and a low forward voltage may be achieved.

According to one or more embodiments of the present disclosure, both the first bump pad 147a and the second bump pad 147b may be disposed over the second conductivity type semiconductor layer 133, and thus, may be flip bonded to emit light through the substrate 121. In particular, the first bump pad 147a is electrically connected to the first conductivity type semiconductor layer 127 from a side of the second conductivity type semiconductor layer 133, and for this purpose, the second conductivity type semiconductor layer 133 is patterned to expose the first conductivity type semiconductor layer 127. The flip-chip light emitting diode includes the V-pit described above in connection with FIGS. 1-3 and has peaks at a plurality of wavelengths. The V-pit structure as shown in FIGS. 1-3 is much smaller in size than the size of the light emitting diode structures shown in FIG. 4A and FIG. 4B and therefore, is not shown in FIG. 4A and FIG. 4B. As shown in FIG. 3, when a growth surface of the nitride semiconductor layer is a C-plane, the V-pits 29v, having a hexagonal cone shape, are formed.

According to the teachings of the present disclosure, it is possible to provide a flip-chip type light emitting diode capable of implementing white light without a phosphor. As a phosphor process for manufacturing the white light diode may be omitted, a production cost may be reduced, and further, a white light source having a thin thickness reduced by a thickness of the phosphor may be applied to an application product.

Alternatively or additionally, a color filter (not shown) may be disposed on the substrate 121 of the flip-chip type light emitting diode. The color filter may be, for example, an interference filter formed by alternately stacking material layers having different refractive indices, such as a band pad filter, a long wavelength transmission filter, a short wavelength transmission filter, or an absorption filter. By using the color filter, light having a specific peak wavelength among a plurality of peak wavelengths emitted from the light emitting diode may be emitted, and light having a different peak wavelength from the specific peak wavelength may be blocked. For example, a color filter to block light on a short wavelength side may be applied to selectively transmit light on a long wavelength side, and on the contrary, a color filter to block light on the long wavelength side may be applied to selectively transmit light on the short wavelength side. In the case of the interference filter, a thickness of each layer of the color filter and the number of layers thereof may be set depending on a wavelength of light to be transmitted. In addition, transmittance of transmitted light may be adjusted, and a mixing ratio of colors may be easily controlled by adjusting the transmittance of transmitted light.

Figure 5A:
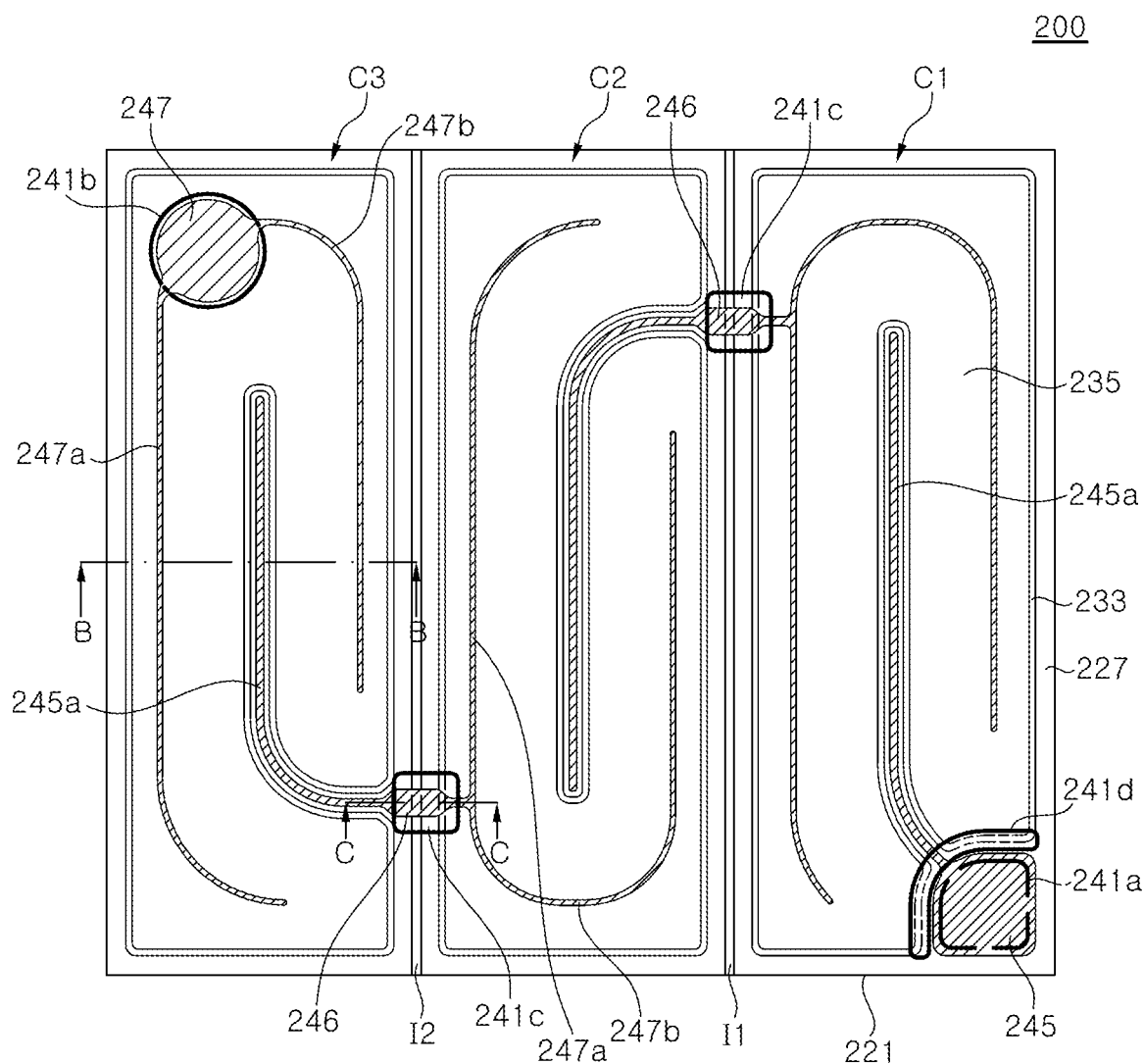
FIG. 5A is a schematic plan view illustrating a light emitting diode having a plurality of light emitting cells according to another embodiment.
Figure 5B:
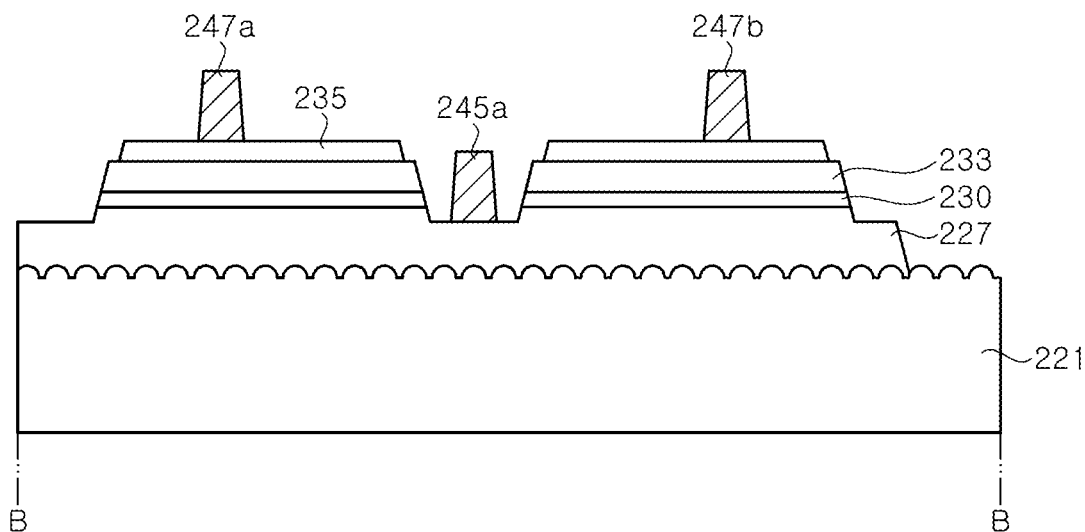
FIG. 5B is a schematic cross-sectional view taken along line B-B of FIG. 5A.
Figure 5C:
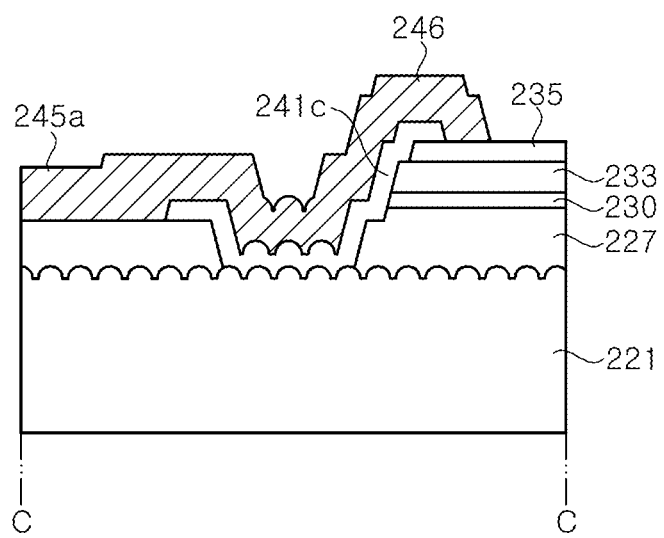
FIG. 5C is a schematic cross-sectional view taken along line C-C of FIG. 5A.

FIG. 5A is a schematic plan view illustrating a light emitting diode having a plurality of light emitting cells according to another exemplary embodiment, FIG. 5B is a schematic cross-sectional view taken along line B-B of FIG. 5A, and FIG. 5C is a schematic cross-sectional view taken along line C-C of FIG. 5A.

Referring to FIGS. 5A, 5B, and 5C, the light emitting diode 200 according to the illustrated exemplary embodiment includes a substrate 221, a first conductivity type semiconductor layer 227, an active layer 230, and a second conductivity type semiconductor layer 233, a transparent electrode 235, insulation layers 241a, 241b, 241c, and 241d, a first electrode pad 245, a second electrode pad 247, first extensions 245a, second extensions 247a, and third extensions 247b. Herein, the semiconductor layers 227, 230, and 233 are divided into a plurality of light emitting cells C1, C2, and C3, and the first, second, and third extensions 245a, 247a, and 247b are disposed on each of the light emitting cells C1, C2, and C3.

In the exemplary embodiment, since the substrate 221, the first conductivity type semiconductor layer 227, the active layer 230, and the second conductivity type semiconductor layer 233 are similar to those described with reference to FIG. 1, repeated descriptions thereof will be omitted. Further, although not shown here, as described with reference to FIG. 1, a nucleation layer and a high temperature buffer layer may be interposed between the substrate 221 and the first conductivity type semiconductor layer 227, and a V-pit generation layer may be interposed between the first conductivity type semiconductor layer 227 and the active layer 230. In addition, a p-type AlGaN layer may be interposed between the active layer 230 and the second conductivity type semiconductor layer 233.

As shown in the plan view of FIG. 1, the substrate 221 may have a rectangular or square shape, but the inventive concepts are not limited thereto. A size of the substrate 221 is not particularly limited, but may be variously selected.

The semiconductor layers 227, 230, and 233 are divided into a plurality (n) of light emitting cells C1, C2, and C3 by cell isolation regions I1 and I2. Although three light emitting cells C1, C2, and C3 are shown in FIG. 1, the inventive concepts are not limited thereto. The n may be an integer of two or more, in particular, an integer of three or more. Furthermore, when the n is an odd number, it is advantageous because the electrode pads 245 and 247 may be disposed in a diagonal direction of the substrate 221.

The light emitting cells C1, C2, and C3 may have an elongated rectangular shape, and may be disposed to be parallel to one another. Accordingly, the even-numbered light emitting cells C2 are disposed between the odd-numbered light emitting cells C1 and C3.

Both sidewalls of the cell isolation regions I1 and I2 are formed using photolithography and etching processes, and have relatively gentle slopes in consideration of reliability of connectors 246.

However, side surfaces of the substrate 221 (see the left side surface of the substrate 221 in FIG. 5B) may be formed using laser scribing unlike the cell isolation regions I1 and I2, and thus, have relatively steep slopes. In particular, the substrate 221 and the first conductivity type semiconductor layer 227 may be separated together from other light emitting diodes using laser scribing, and thus, the side surfaces of the substrate 221 and the first conductivity type semiconductor layer 227 may be flush with each other.

An upper surface of the first conductivity type semiconductor layer 227 may be exposed along edges of the light emitting cells C1, C2, and C3. That is, the second conductivity type semiconductor layer 233 is surrounded by the exposed upper surface of the first conductivity type semiconductor layer 227. The upper surface of the first conductivity type semiconductor layer 227 may be exposed along an entire periphery of the second conductivity type semiconductor layer 233.

The transparent electrode layer 235 is located on the second conductivity type semiconductor layer 233 of each of the light emitting cells C1, C2, and C3. The transparent electrode layer 29 may be formed of a conductive oxide layer, such as ITO or ZnO, and is in contact with the second conductivity type semiconductor layer 233. That is, the transparent electrode layer 235 electrically contacts the second conductivity type semiconductor layer 233 and has a lower resistivity than the second conductivity type semiconductor layer 233 to spread current over a wide region of the light emitting diode.

The transparent electrode layer 235 has substantially an identical planar shape as the second conductivity type semiconductor layer 233. However, the transparent electrode layer 235 may have a smaller area than the second conductivity type semiconductor layer 233. All of lower surfaces of the transparent electrode layer 235 may contact the upper surface of the second conductivity type semiconductor layer 233.

When the transparent electrode layer 235 is formed of ZnO, it may include another material as long as Zn and O constitute most of a compound and retain a Wurtzite crystal structure of ZnO. For example, the ZnO transparent electrode layer 235 includes aluminum doped zinc oxide (AZO), gallium doped zinc oxide (GZO), and indium doped zinc oxide (IZO). The ZnO transparent electrode 235 also includes a material with a small amount of another dopant and/or another impurity or an inclusion material, as well as a non-stoichiometric material due to the presence of vacancy and interstitial material defects.

The ZnO transparent electrode layer 235 may have a thickness of about 5 times or more of a general thickness of an ITO film. For example, the ITO transparent electrode layer 235 may be formed to have a thickness of about 500 Å or less, but since the ZnO transparent electrode layer 235 has a low absorption rate, it may be formed to have a thickness of 1000 Å or more, and further, about 5000 Å or more. An upper limit of the ZnO transparent electrode layer 235 is not particularly limited, but may be about 1 μm or less.

When the transparent electrode layer 235 is formed of ZnO, it may be formed relatively thicker than ITO or other conductive oxides, so that sheet resistance may be reduced, and thus, current may be more easily spread. However, in the exemplary embodiment, the transparent electrode layer 235 is not necessarily limited to ZnO.

As illustrated in FIG. 5A, the first electrode pad 245 may be disposed on the first light emitting cell C1, and the second electrode pad 247 may be disposed on the third light emitting cell C3. The first electrode pad 245 may be disposed on the exposed upper surface of the first conductivity type semiconductor layer 227. However, the inventive concepts are not limited thereto, and the first electrode pad 245 may be disposed on the second conductivity type semiconductor layer 233 with an insulation layer therebetween. Further, the first electrode pad 245 may be disposed near one corner of the first light emitting cell C1.

Meanwhile, the first extension 245a is electrically connected to the first conductivity type semiconductor layer 227 exposed through a mesa etching process. The first extension 245a on the first light emitting cell C1 may extend from the first electrode pad 245, and the first extensions 245a on the light emitting cells C2 and C3 may extend from the connectors 246, respectively.

The second electrode pad 247 may be disposed on the transparent electrode layer 235. The second electrode pad 247 may be disposed near another corner of the substrate 221 opposite to the first electrode pad 245, and accordingly, a process of bonding a wire may be easily performed.

Meanwhile, as shown in FIG. 5A, the second extension 247a and the third extension 247b on each of the light emitting cells C1, C2, and C3 may be located on the transparent electrode layer 235 to surround the first extension 245a. In the exemplary embodiment, since the second electrode pad 247 is not disposed on all of the light emitting cells C1, C2, and C3, not all of the second extensions 247a and the third extensions 247b extend from the second electrode pad 247. As shown in FIG. 5A, the second extension 247a and the third extension 247b on the third light emitting cell C3 extend from the second electrode pad 247, but the second extension 247a and the third extension 247b on the first and second light emitting cells C1 and C2 are spaced apart from the second electrode pad 247, and extend from the connector 246 electrically connecting the light emitting cells.

The second extensions 247a and the third extensions 247b are located on the transparent electrode layer 235 on each of the light emitting cells C1, C2, and C3 and are electrically connected to the transparent electrode layer 235, respectively.

The connectors 246 electrically connect adjacent light emitting cells. Specifically, the connectors 246 connect the first extension 245a of one light emitting cell and the second and third extensions 247a and 247b of an adjacent light emitting cell. As well shown in FIG. 5C, one end of the connector 246 may be located on the first conductivity type semiconductor layer 227 to be connected to the first extension 245a, and the other end thereof may be located on the second conductivity type semiconductor layer 233. As it can be seen in FIG. 5A, the other end of the connector 246 located on the second conductivity type semiconductor layer 233 is connected to the second and third extensions 247a and 247b in the light emitting cell, C2.

In the remaining light emitting cells, for example C2, except for the first light emitting cell C1 and the third light emitting cell C3, two connectors 246 are disposed near corners in the diagonal direction, as shown in FIG. 5A. The connector 246 connected to the first light emitting cell C1 is disposed near a corner in the diagonal direction opposite to the first electrode pad 245, and the connector 246 connected to the third light emitting cell C3 is disposed near a corner in the diagonal direction opposite to the second electrode pad 247, as shown in FIG. 5A. Meanwhile, the first, second, and third extensions 245a, 247a, and 247b on the first light emitting cell C1 and the first, second, and third extensions on the second light emitting cell C2 have a substantially similar shape. In some forms, the first, second, and third extensions 245a, 247a, and 247b on the second light emitting cell C2 and the first, second, and third extensions on the third light emitting cell C3 also have a substantially similar shape. Since the first, second, and third extensions 245a, 247a, and 247b on the adjacent light emitting cells are arranged in a shape inverted to each other, while forming the first extension 245a relatively lengthily in a single line, lengths of the second extension 247a and the third extension 247b may be designed to be substantially identical or similar. A substantially uniform current spread may be achieved at both sides of the first extension 245a.

In some forms, the first electrode pad 245, the second electrode pad 247, the first extensions 245a, the connectors 246, the second extensions 247a, and the third extensions 247b may be formed together with an identical material with a single process. However, the inventive concepts are not limited thereto, and in other forms, different materials and/or different processes may be used to form the first electrode pad 245, the second electrode pad 247, the first extensions 245a, the connectors 246, the second extensions 247a, the third extensions 247b, or a combination thereof.

The first insulation layer 241a may be located under the first electrode pad 245, as shown in FIG. 5A. The first insulation layer 241a mitigates direct current flow from the first electrode pad 245 to the first conductivity type semiconductor layer 227 and contributes to current spread. The first insulation layer 241a may be disposed under a partial region of the first electrode pad 245, and thus, an edge region of the first electrode pad 245 may be connected to the first conductivity type semiconductor layer 227. By adjusting an area of the first insulation layer 241a and an area of the first electrode pad 245, an area in which the first electrode pad 245 contacts the first conductivity type semiconductor layer 227 may be adjusted, and a forward voltage may be controlled accordingly.

The second insulation layer 241b is disposed under the second electrode pad 247, and thus, may separate the second electrode pad 247 from the transparent electrode layer 235. For example, as shown in FIG. 5A, the second insulation layer 241b may be formed in a disk shape and may have a larger area than the second electrode pad 247. The second electrode pad 247 may be disposed on the insulation layer 241b to be spaced apart from the transparent electrode layer 29. However, the inventive concepts are not limited thereto, and the second insulation layer 241b may be formed to have an opening, and the second electrode pad 247 may partially contact the transparent electrode layer 235. As the second electrode pad 247 is disposed on the second insulation layer 241b, concentration of current under the second electrode pad 247 may be alleviated.

Meanwhile, the third insulation layer 241c may be interposed under the connector 246 to prevent the first conductivity type semiconductor layer 227 and the second conductivity type semiconductor layer 233 in one light emitting cell from being short-circuited by the connector 246.

In addition, the fourth insulation layer 241d may cover sidewalls of the active layer 230 and the second conductivity type semiconductor layer 233 exposed around the first electrode pad 245. When a wire is bonded to the first electrode pad 245, the fourth insulation layer 241d prevents the bonding wire from being short-circuited to the second conductivity type semiconductor layer 233 or the active layer 230. In some forms, the fourth insulation layer 241d may be formed in a continuous curved shape, and the first extension 245a may pass over the fourth insulation layer 241d. However, the inventive concepts are not limited thereto. In other forms, a portion of the fourth insulation layer 241d may be omitted, and the first extension 245a may pass through the omitted portion of the fourth insulation layer 241d.

In some forms, the first, second, third, and fourth insulation layers 241a, 241b, 241c, and 241d may be formed together with an identical material with a single process. In particular, these insulation layers 241a, 241b, 241c, and 241d may be formed using a lift-off process, and may be formed as a distributed Bragg reflector. In other forms, the first, second, third, and fourth insulation layers 241a, 241b, 241c, and 241d may be formed separately.

According to one or more embodiments, the light emitting diode includes the plurality of light emitting cells C1, C2, and C3 divided by the isolation regions I1 and I2, and these light emitting cells C1, C2, and C3 are electrically connected in series with one another. However, the inventive concepts are not limited thereto, and the light emitting cells C1, C2, and C3 may be connected in parallel or series-parallel. In particular, when the light emitting cells C1, C2, and C3 are connected in series, an operating voltage of the light emitting diode may be increased.

Figure 6:
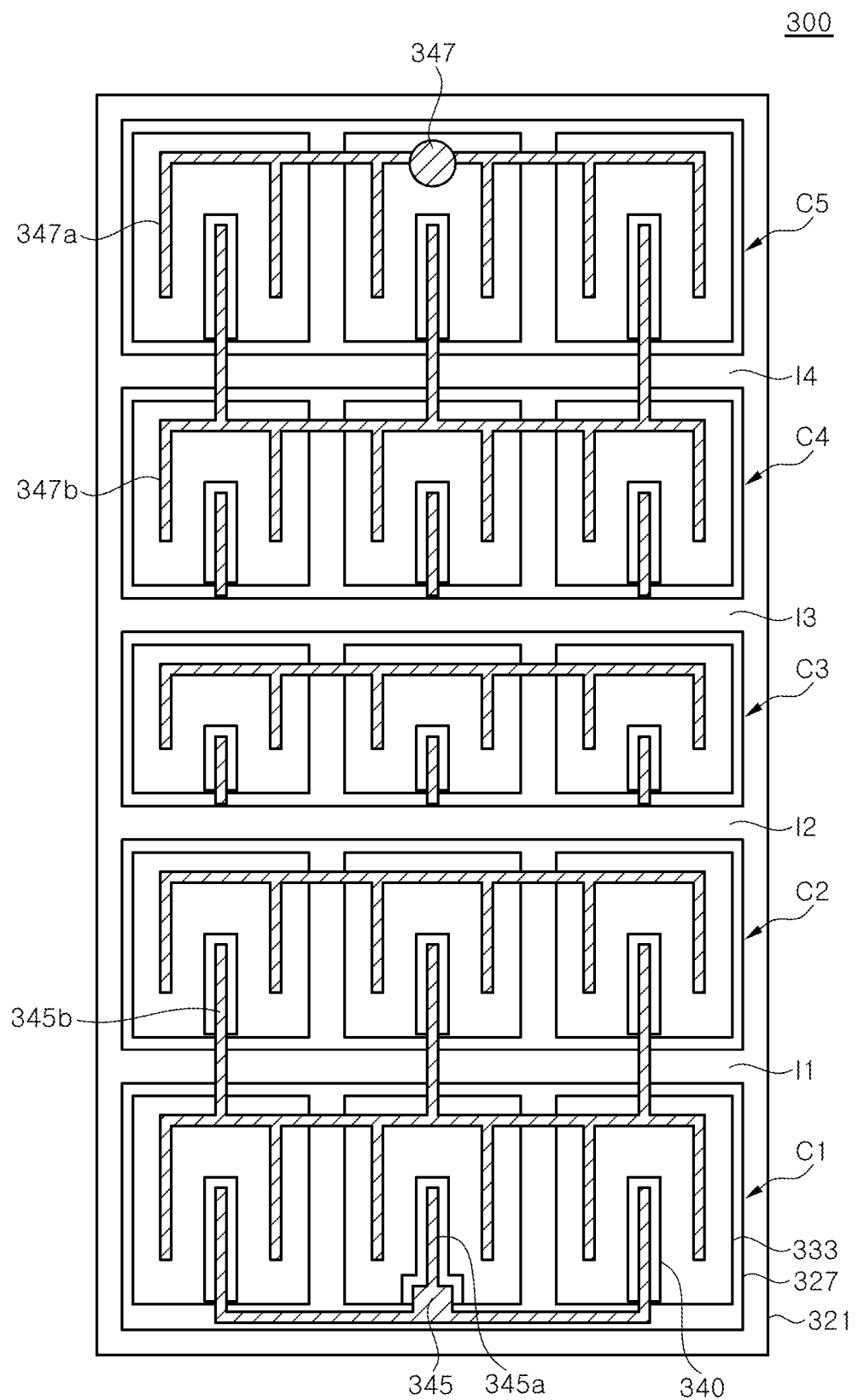
FIG. 6 is a schematic plan view illustrating a light emitting diode having a plurality of light emitting cells according to another exemplary embodiment.

FIG. 6 is a schematic plan view illustrating a light emitting diode 300 having a plurality of light emitting cells according to another exemplary embodiment.

Referring to FIG. 6, the light emitting diode 300 includes a plurality of light emitting cells C1, C2, C3, C4, and C5 which are similar to the light emitting diode described with reference to FIGS. 5A, 5B, and 5C. Light emitting areas of the light emitting cells C1, C2, C3, C4, and C5 are different from one another.

The light emitting diode 300 includes a substrate 321, a first conductivity type semiconductor layer 327, an active layer, a second conductivity type semiconductor layer 333, a first electrode pad 345, and a second electrode pad 347, and extensions 345a, 345b, 347a, and 347b. In addition, although not shown in the drawing, similar to the light emitting diode described with reference to FIGS. 5A, 5B, and 5C, a transparent electrode layer may be disposed on the second conductivity type semiconductor layer 233 of each of the light emitting cells. Further, the light emitting diode 300 may include a nucleation layer, a high temperature buffer layer, a V-pit generation layer, and a p-AlGaN layer, similar to those in the above-described exemplary embodiments as shown in and described in connection with FIGS. 1-3.

Since a stacked structure of the light emitting cells C1, C2, C3, C4, and C5, and a connection structure of the first electrode pad 345, the second electrode pad 347, and the extensions 345a, 345b, 347a, and 347b are similar to those described with reference to FIGS. 5A, 5B, and 5C, detailed descriptions are omitted to avoid redundancy. In addition, an insulation layer may at least partially cover the light emitting cells C1, C2, C3, C4, and C5 for electrical insulation, and at least partially cover a region therebetween.

The light emitting cells C1, C2, C3, C4, and C5 may be divided from one another by cell isolation regions I1, I2, I3, and I4. For example, the first conductivity type semiconductor layer 327 is also divided from one another by the cell isolation regions I1, I2, I3, and I4. In an exemplary embodiment, the light emitting cells arranged in an identical row may share the first conductivity type semiconductor layer 327. That is, three light emitting cells arranged in the identical row in FIG. 6 may be disposed on a continuous first conductivity type semiconductor layer 327. In another exemplary embodiment, light emitting cells in an identical row may be divided from one another by the cell isolation regions.

In the exemplary embodiment, the light emitting cells C1, C2, C3, C4, and C5 are connected in series-parallel. That is, the light emitting cells arranged in an identical row are connected in parallel, and these light emitting cells are connected to one another in series by the extensions 345a, 345b, 347a, and 347b between the first electrode pad 345 and the second electrode pad 347.

Meanwhile, the light emitting cells C1, C2, C3, C4, and C5 have different sizes from one another. For example, the light emitting cell C3 may have a smaller light emitting area than the light emitting cell C2, and the light emitting cell C2 may have a smaller area than the light emitting cell C1. The light emitting cell C1 may have an identical light emitting area as the light emitting cell C5, and the light emitting cell C2 may have an identical light emitting area as the light emitting cell C4.

Under a substantially identical current, a current density changes depending on the size of the light emitting area. A light emitting cell having a high current density may emit light having a plurality of peak wavelengths, and a light emitting cell having a low current density may emit yellow light. As such, a color of light emitted from each of the light emitting cells may be adjusted by changing the size of the light emitting cells.

In the exemplary embodiment, although it is described that the light emitting cells are arranged in an order of decreasing the light emitting area from the first electrode pad 345 toward the second electrode pad 347 and then increasing again, the inventive concepts are not limited thereto. The light emitting cells having different light emitting areas may be arranged in various ways. Furthermore, light emitting cells arranged in the identical row may have different light emitting areas.

According to the exemplary embodiments, it is possible to provide a multicell light emitting diode capable of implementing white light without a phosphor. Since a phosphor process for manufacturing the white light diode may be omitted, a production cost may be reduced, and further, a white light source having a thin thickness reduced by a thickness of the phosphor may be applied to an application product.

Figure 7A:
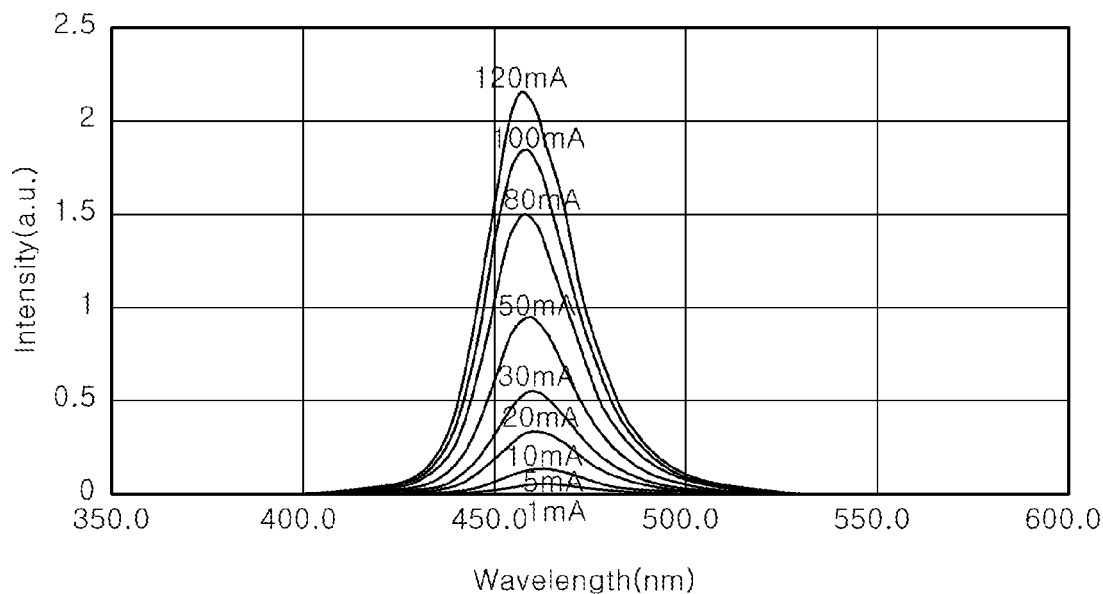
FIG. 7A is a graph showing a spectrum depending on current of a blue light emitting diode of Comparative Example.
Figure 7B:
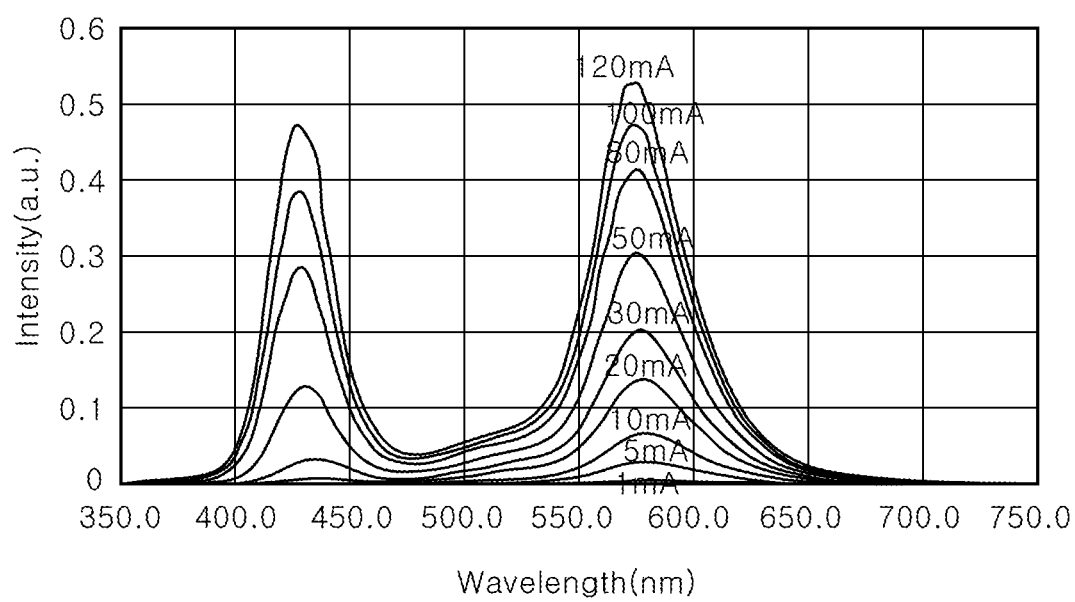
FIG. 7B is a graph showing a spectrum depending on current of a light emitting diode according to an exemplary embodiment.

FIG. 7A is a graph showing a spectrum depending on current of a blue light emitting diode of Comparative Example, and FIG. 7B is a graph showing a spectrum depending on current of a light emitting diode according to an exemplary embodiment.

Referring to FIG. 7A, in the blue light emitting diode of Comparative Example, an intensity of blue light increases as the current increases, but there is little change in emission wavelengths. Therefore, to implement white light, a light emitting diode of another color has to be added or a phosphor has to be used in addition to the blue light emitting diode.

Referring to FIG. 7B, when the light emitting diode according to the exemplary embodiment has a small current, it has a peak wavelength in a yellow region, but as the current increases, a peak wavelength in a blue region as well as that in a yellow region is observed. That is, the light emitting diode according to the illustrated exemplary embodiment may implement mixed color light, such as white light, in which blue light and yellow light are mixed as a driving current increases.

Figure 8A:
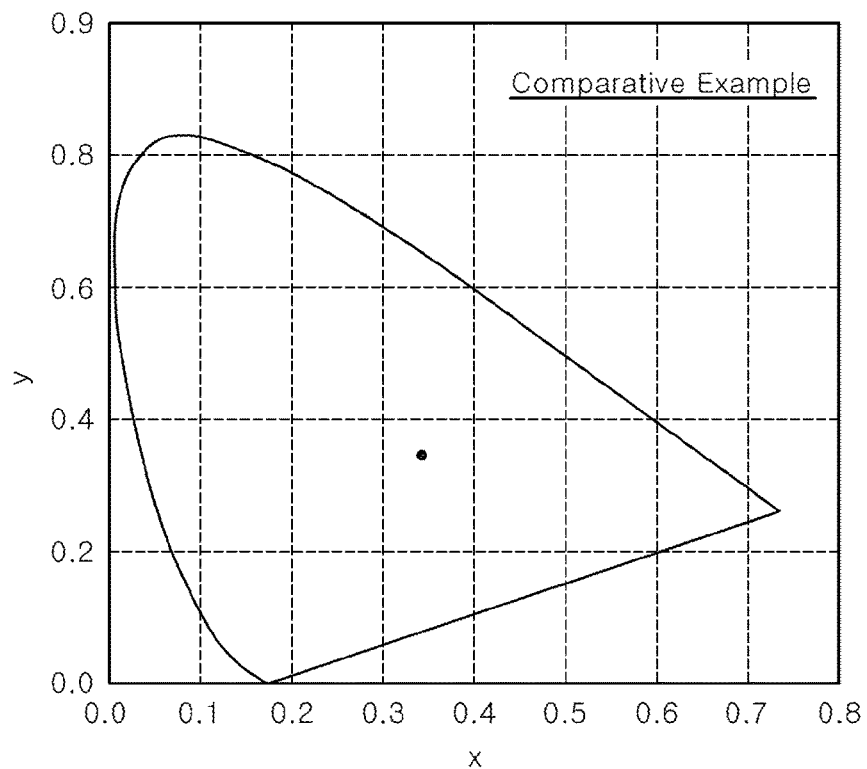
FIG. 8A is a graph showing color coordinates of a white light emitting diode package in Comparative Example.
Figure 8B:
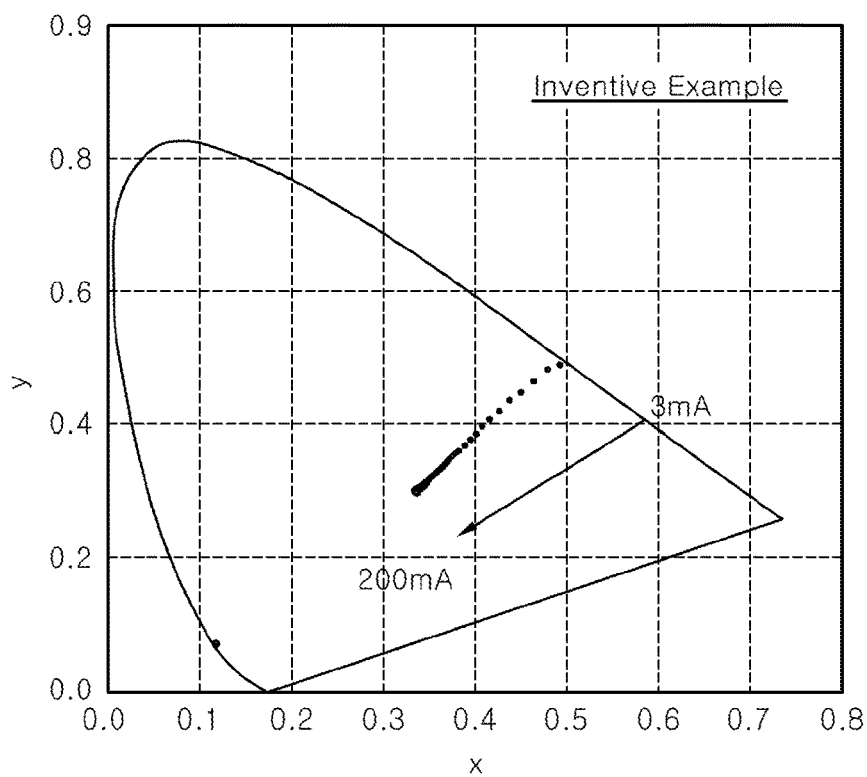
FIG. 8B is a graph illustrating color coordinates depending on current of a white light emitting diode package according to an exemplary embodiment.

FIG. 8A is a graph showing color coordinates of a white light emitting diode package in Comparative Example, and FIG. 8B is a graph illustrating color coordinates depending on current of a white light emitting diode package according to an exemplary embodiment. Herein, the light emitting diode packages of Comparative Example and Inventive Example were all manufactured using a 5630 package of Seoul Semiconductor. However, in the Comparative Example, a blue chip was mounted in the package, and a molding member having a phosphor spread therein was used to implement white light. In contrast, in the Inventive Example, a lateral light emitting chip according to the exemplary embodiment is mounted in the package.

First, referring to FIG. 8A, the light emitting diode package of Comparative Example exhibits color coordinates of one point, and this location corresponds to a white region.

Referring to FIG. 8B, in the light emitting diode package of Inventive Example, as the current increases, color of light emitted changes from yellow light to white light. Yellow light is displayed under a current condition of 3 mA, but white light is displayed at 100 mA.

Electrical and optical characteristics of Comparative Example and Inventive Example under a driving current of 100 mA are briefly summarized in Table 1.

TABLE 1

| PKG@100 mA | Voltage(V) | x-coordinate | y- coordinate | CCT/K |
|---|---|---|---|---|
| Comparative Example | 3.0 | 0.34 | 0.35 | 5096 |
| Inventive Example | 3.1 | 0.36 | 0.34 | 4264 |

Referring to Table 1, it can be seen that the light emitting diode package of Inventive Example exhibits x-y coordinates substantially similar to those of the white light emitting diode package of Comparative Example using a phosphor.

The light emitting diode according to the exemplary embodiments may emit light having a plurality of peak wavelengths in a visible light region without using the phosphor, and by using this, it may implement white light without the phosphor.

Since the light emitting diode according to the exemplary embodiments emits light having a plurality of distinct peak wavelengths, it is advantageous to extract and use light having a desired peak wavelength using a color filter.

The light emitting diode according to the exemplary embodiments may be applied not only to a lighting field but also to a wireless communication field. In particular, since light having multiple peak wavelengths may be emitted in a visible region, it may be suitably used for visible light communication (VLC) such as Li-Fi.

As the visible region covers a range of 380 THz to 750 THz, it is about 10,000 times wider than an entire frequency range of conventional wireless communication. A conventional white light emitting diode using a phosphor is not suitable for use in VLC because response delays occur due to the phosphor and frequency response is slow, but the light emitting diode according to the exemplary embodiments emits light of multiple peak wavelengths in the visible region without a phosphor, so that it may be suitable for use in VLC.

Although some embodiments have been described herein, it should be understood that these embodiments are provided for illustration only and are not to be construed in any way as limiting the present disclosure. It should be understood that features or components of an exemplary embodiment can also be applied to other embodiments without departing from the spirit and scope of the present disclosure.

What is claimed is:

1. A light emitting diode, comprising:
an n-type nitride semiconductor layer;
an active layer located on the n-type nitride semiconductor layer; and
a p-type nitride semiconductor layer located on the active layer,
wherein: the active layer has a single structure of a multi-quantum well in which a plurality of barrier layers and a plurality of well layers are stacked, the active layer includes a first portion configured to emit light of a first peak wavelength and a second portion configured to emit light of a second peak wavelength that differs from the first peak wavelength, and a relative intensity of light emitted by the first and second portions changes as a driving current changes between 3 mA and 100 mA.

2. The light emitting diode of claim 1, wherein the active layer emits light having a color coordinate (x, y), and wherein at least one of x or y gets smaller as the driving current increases between 3 mA and 100 mA.

3. The light emitting diode of claim 1, wherein the first and second peak wavelengths include blue light and yellow light, the combination of which changes from yellow light to white light as the driving current increases between 3 mA and 100 mA.

4. The light emitting diode of claim 1, further comprising:
a V-pit generation layer disposed between the n-type nitride semiconductor layer and the active layer, wherein one of the first or second portions of the active layer is formed in a V-pit of the V-pit generation layer.

5. The light emitting diode of claim 4, wherein: the V-pit generation layer has a thickness exceeding 450 nm, and the V-pits formed in the V-pit generation layer include a V-pit having a width of an inlet exceeding 230 nm.

6. The light emitting diode of claim 4, further comprising:
a p-type AlGaN layer interposed between the active layer and the p-type nitride semiconductor layer, wherein a composition ratio x of Al in the p-type AlGaN layer is greater than 0 and less than 0.3.

7. The light emitting diode of claim 6, wherein the p-type AlGaN layer has a thickness of less than 100 nm.

8. The light emitting diode of claim 6, wherein: the active layer further includes a capping layer covering the well layer and disposed between the well layer and the barrier layer, and the capping layer contains Al.

9. The light emitting diode of claim 1, wherein the light emitting diode has a flip-chip structure.

10. The light emitting diode of claim 1, wherein the light emitting diode has a plurality of light emitting cells.

11. The light emitting diode of claim 10, wherein each light emitting cell has a different light emitting area from one another.

12. The light emitting diode of claim 11, wherein the light emitting cells are connected in series.

13. A light emitting apparatus, comprising:
a light emitting diode; and
a color filter disposed over the light emitting diode, wherein the light emitting diode includes:
an n-type nitride semiconductor layer;
an active layer located on the n-type nitride semiconductor layer; and
a p-type nitride semiconductor layer located on the active layer,
wherein: the active layer has a single structure of a multi-quantum well in which a plurality of barrier layers and a plurality of well layers are stacked, and the active layer includes quantum well portions configured to emit mixed color light having at least two peak wavelengths, wherein the mixed color light changes as a driving current changes between 3 mA and 100 mA.

14. The light emitting apparatus of claim 13, further comprising: a V-pit generation layer disposed between the n-type nitride semiconductor layer and the active layer, wherein a portion of the active layer configured to emit light having one of the at least two peak wavelengths is formed in a V-pit of the V-pit generation layer.

15. The light emitting apparatus of claim 14, wherein: the V-pit generation layer has a thickness exceeding 450 nm, and the V-pits formed in the V-pit generation layer include a V-pit having a width of an inlet exceeding 230 nm.

16. The light emitting apparatus of claim 14, further comprising: a p-type AlGaN layer interposed between the active layer and the p-type nitride semiconductor layer, wherein a composition ratio x of Al in the p-type AlGaN layer is greater than 0 and less than 0.1.

17. The light emitting apparatus of claim 16, wherein the p-type AlGaN layer has a thickness of less than 100 nm.

18. The light emitting apparatus of claim 16, wherein: the active layer further includes a capping layer covering the well layer and disposed between the well layer and the barrier layer, and the capping layer contains Al.

19. The light emitting apparatus of claim 13, wherein the light emitting diode has a flip-chip structure.

20. The light emitting apparatus of claim 13, wherein the color filter is a band pass filter, a long wavelength transmission filter, or a short wavelength transmission filter.

* * * * *